United States Patent

Courtenay

[11] Patent Number: 5,902,399
[45] Date of Patent: May 11, 1999

[54] METHOD AND APPARATUS FOR IMPROVED COATING OF A SEMICONDUCTOR WAFER

[75] Inventor: Robert William Courtenay, Boise, Id.

[73] Assignee: Micron Technology, Inc., Boise, Id.

[21] Appl. No.: 08/949,072

[22] Filed: Oct. 10, 1997

Related U.S. Application Data

[63] Continuation of application No. 08/508,051, Jul. 27, 1995, abandoned.

[51] Int. Cl.⁶ .............................. B05C 11/02; B05B 13/02
[52] U.S. Cl. .............................. 118/52; 118/321; 118/323; 118/715; 427/240
[58] Field of Search .............................. 427/240; 118/52, 118/321, 323, 715, 718, 729

[56] References Cited

U.S. PATENT DOCUMENTS

| | | | |
|---|---|---|---|
| 4,190,015 | 2/1980 | Hillman | 118/696 |
| 4,267,212 | 5/1981 | Sakawaki | 427/240 |
| 4,457,259 | 7/1984 | Samuels | 118/705 |
| 4,640,222 | 2/1987 | Gerber | 118/697 |
| 5,250,114 | 10/1993 | Konishi et al. | 118/321 |
| 5,405,443 | 4/1995 | Akimoto et al. | 118/668 |

*Primary Examiner*—Shrive Beck
*Assistant Examiner*—Michael Barr

[57] ABSTRACT

A method and apparatus for coating liquid films on to the surface of a wafer substrate by rotation the substrate at a speed sufficient to cause a liquid, through centrifugal effect, to flow outwardly toward the perimeter of the surface and form a substantially uniform thickness liquid coating thereon and starting at the central region of the wafer surface and moving radially outward therefrom, spraying a fine mist of the liquid to the surface of the wafer.

1 Claim, 2 Drawing Sheets

METHOD AND APPARATUS FOR IMPROVED COATING OF A SEMICONDUCTOR WAFER

RELATED APPLICATION

This application is a continuation of U.S. application Ser. No. 08/508,051, filed Jul. 27, 1995, now abandoned.

BACKGROUND OF THE INVENTION

1. Technical Field

The present invention relates to an apparatus and process for coating solutions on to the surface of semiconductor wafers.

2. Background

The current practice in semiconductor manufacturing is to use thin film fabrication techniques. A large variety of materials can be deposited using thin films, including metals, semiconductors, insulators and the like. The composition and uniformity of these thin layers must be strictly controlled to facilitate etching of submicron features. Many of these materials are best suited to application of the substrate with a liquid which is then dried to form the solid thin film. The liquid materials are most often deposited using either spin or spray coating methods.

In a conventional spin coating process the semiconductor wafer to be processed is placed on a rotatable chuck and held in place by vacuum. The chuck is referred to by a variety of names, including spin chuck and vacuum chuck. The spin chuck has a diameter slightly less than that of the semiconductor wafer. The wafer is positioned on the chuck such that it is resting in a level horizontal plane with the inactive surface, designated as the bottom, in contact with the chuck and the opposite top surface is coated with the desired solution. In standard systems the chuck is powered and rotated by a motor.

In the spin coating process, the solution can be dispensed prior to spinning the wafer, which is referred to as static dispense or after the semiconductor wafer has been set in motion, which is termed dynamic dispense. In either case after the solution has been dispensed onto the top surface, the wafer is spun at a constant speed to establish a desired relatively uniform thickness of the solution across the wafer. Once the liquid layer acquires the relatively uniform and symmetrical profile, the remainder of the spin cycle allows the solvent in the solution to evaporate to produce a solid film on the wafer top surface.

The supply of the solution is dispensed onto the wafer from a supply nozzle. The nozzle can either be configured to simply drop a specific quantity onto the semiconductor wafer surface in the form of a puddle or to spray the desired quantity onto the wafer surface in the form of a mist.

After the solution is dispensed onto the wafer it is distributed uniformly over the surface largely as a result of the radial distribution of the liquid due to centrifugal and drag forces created by the spinning of the wafer.

The solution deposited on the wafer goes through a number of stages during the spin process, primarily due to the fluid dynamics created by the spinning substrate. At the start of the spinning a wave of solution is created that moves towards the edge of the wafer. As the major portion of the solution in the wave reaches the edge of the wafer it forms a ridge, this is referred to as the corona stage. A bead subsequently forms along the edge of the wafer as the solvent evaporates from the ridge formed in the corona stage. As the corona disappears the remaining solution leaves the surface in the form of a fine spiral-like mist. This spiral stage results in thousands of droplets spinning off the wafer and splashing back onto the wafer off of the surrounding spinner bowl. Bowls and splashguards have been designed to prevent this splashing. Additionally, solvent washing of the bottom of the wafer can eliminate the edge bead that forms during the spin coating.

Every layer deposited on the top surface of the wafer that possesses irregularities and variations in its uniformity has an adverse affect during all subsequent processing steps that the wafer undergoes. Uniformity of the layers is a critical factor in semiconductor wafer production. The film thickness uniformity obtained using the spin coating process is largely a function of size and shape of the wafer, because of the influence centrifugal force has in the spin coat process. The fluid dynamics described above become more pronounced as the diameter of the wafer used increases and the trend is towards using larger wafers.

To compensate for these undesirable influences the standard practice is to use a large starting volume of solution in the spin coating process. A large starting volume of solution also translates into a large amount of wasted solution. The increased amount of solution used also means an increase in the cost of production for semiconductor wafers. Approximately 30%–90% of the process solution used in the spin coating process is wasted in the form of excess solution that is thrown off of the wafer substrate. The excess solution is deposited to assure a thin uniform layer in the end product.

There have been a number of inventions proposed to alleviate these problems. U.S. Pat. No. 5,395,649 to Ikeda, employs a plate positioned above the wafer to change the air turbulence and fluid behavior on the wafer for improved layer uniformity.

In U.S. Pat. No. 5,405,813 to Rodrigues, a plurality of rotational speeds are used to increase layer uniformity and decrease the amount of starting solution required.

A number of patents use different types of nozzle mechanisms. U.S. Pat. No. 5,405,443 to Akimoto et al., discloses a nozzle that dispenses a fixed quantity of solution without entrainment of bubbles and particles utilizing a negative pressure system. U.S. Pat. No. 4,267,212 to Shinichi, includes moving the conventional spin coat nozzle across the radius of the wafer during solution application while rotating the wafer at a first and second speed. U.S. Pat. No. 5,403,617 to Haaland, enlists a computer controlled droplet generator to select droplet size and velocity to cause impact with the wafer without splashing. There is still a demand in the semiconductor wafer manufacturing industry for more economical means of solution application to the wafer that improves the uniformity of the process layers on the wafers and uses less chemicals.

The other major process used to deposit dielectrics on to wafer substrates is a spray coat process. The spray coating process permits much more efficient use of the process solution because the large starting excess needed for the spin coating process is not needed for the spray coating process. The problem with conventional spray coat processes are that they require thorough and comprehensive optimization of the process to obtain the quality of uniform layer thickness that is more easily obtained with the spin coat process. With the spray coat process the size and shape of the wafer have little effect on the end result. The uniformity of thickness of dielectric coating obtained using the spray process is determined by the sweeping motion of the spray nozzle.

An alternative to using either the spin coat or spray coat processes and their inherent problems is to coat the wafers using chemical vapor deposition (CVD). The CVD process includes the following basic steps: a) a known composition of reactant and inert gases is introduced into a reaction chamber; b) the gas species move to the substrate; c) the reactants are decomposed and chemically reacted at a heated surface of the substrate; e) the gaseous by-products are desorbed and removed from the reaction chamber. With the CVD process high purity films can be formed and deposited and a greater variety of starting compounds can be used. There are certain compositions that cannot be adequately applied to the wafer by any other process. The CVD process also had certain disadvantages. It increases both the cost of wafer production and increases the complexity of manufacturing the wafer. There are also often defects in the uniformity of the layers deposited on the wafer using the CVD process. Because of the increased cost and complexity of the CVD process it is still used far less that either spin or spray coating of the dielectrics onto semiconductor wafers.

SUMMARY OF THE INVENTION

It is an object of the invention to provide an improved apparatus and method for coating a liquid material on to a semiconductor wafer that decreases the amount of starting material required.

It is another object of the invention to provide an improved method for coating a liquid material on to a semiconductor wafer that has improved environmental health and safety factors.

It is a further object of the invention to provide an improved method for coating a dielectric material on to a semiconductor wafer that is more economical.

These objects, as well as others, are satisfied by a method for coating dielectrics on to the surface of a wafer substrate by rotating the substrate at a speed sufficient to cause a liquid, through centrifugal effect, to flow outwardly toward the perimeter of the surface and form a substantially uniform thickness liquid coating thereon and starting at the central region of the wafer surface and moving radially outward therefrom, spraying a fine mist of the liquid dielectric to the surface of the wafer.

An advantage of the invention is that the amount of liquid that is wasted as excess is reduced from as much as 90% to 10%. Another advantage of the present invention is that less organic solvent is used because less total material is required to coat the wafer satisfactorily. Decreased use of organic solvent improves the indoor air quality of the workplace as well as the safety and overall improvement of the environment, over which their is increasing concern and stricter regulation. The decrease in organic solvents also decreases the risk of flammability and the problems associated with proper disposal of organic solvents. The process of the invention still allows for the decreased amount of material associated with a spray coating process while still yielding the layer uniformity achieved with a spin coating process. This process also does not require the comprehensive fine tuning required in the conventional spray coating process.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Figure 1A:
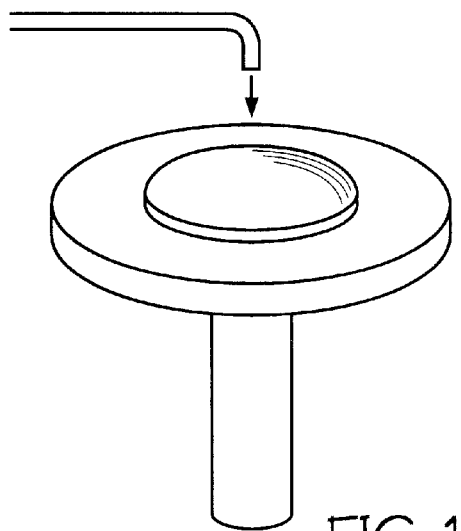
FIG. 1A is a representation of a prior art spin coating device showing a coating liquid pooled at the center of a wafer.
Figure 1B:
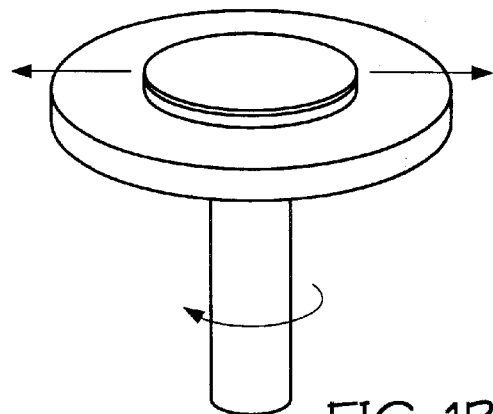
FIG. 1B is a representation of the wafer of FIG. 1A with the wafer spinning to form a thin coat on top of the wafer.
Figure 2:
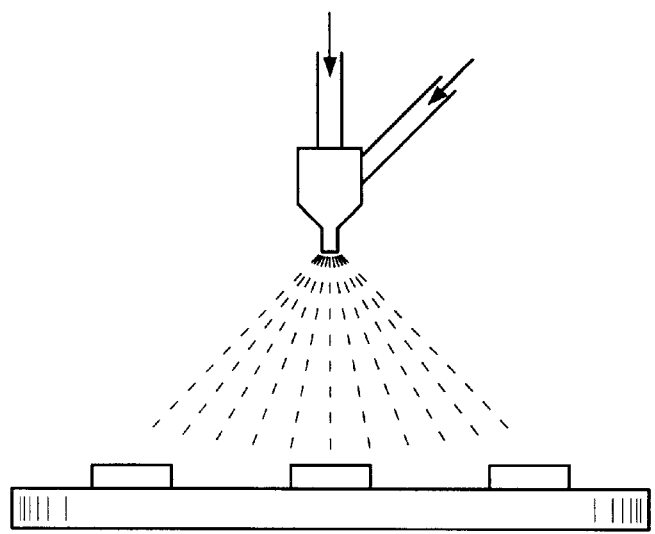
FIG. 2 is a representation of the prior art spray coating process.
Figure 3:
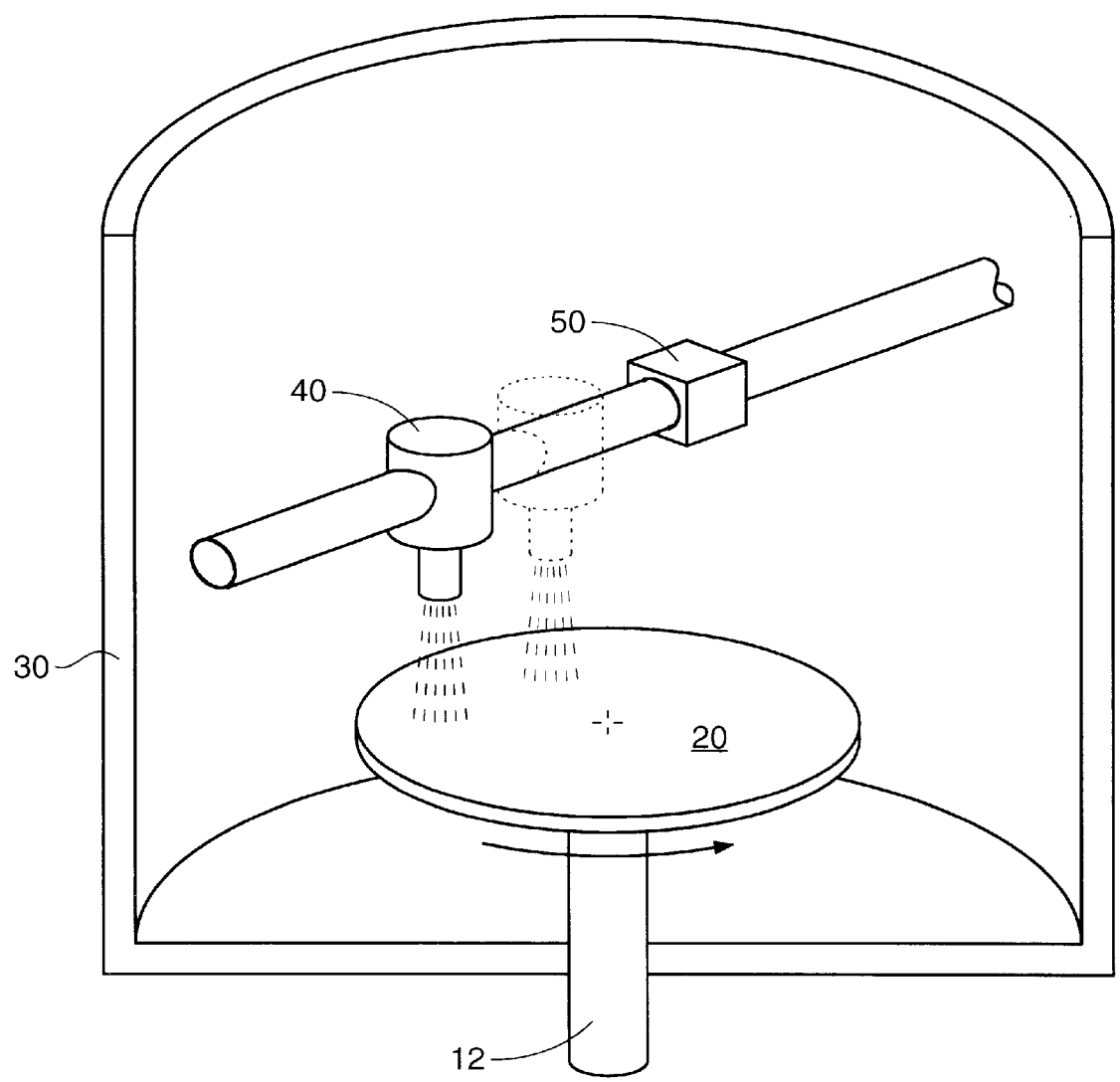
FIG. 3 is a representation of the spray/spin coating process and apparatus according to the invention.

FIGS. 1 and 2 are schematic representations of the prior art. FIG. 3 schematically represents the wafer coating method of the present invention. A spin chuck 12, holds wafer 20 by vacuum to allow spinning of wafer 20. In the preferred embodiment, wafer 20 is rotated at a speed ranging between 500 and 1500 rpm in an 50% relative humidity environment at 72° F., depending the solution that is going to be applied to wafer 20. Spin chuck 12 holding wafer 20 is enclosed by bowl 30 inside a housing. Bowl 30 can be moved up or down to surround wafer 20. Drain and exhaust pipes are connected to the underside of bowl 30. The spatial relationships and operation of spin chuck 12, wafer 20, bowl 30 and the housing are omitted as they are known in the art.

While wafer 20 is being rotated within the proscribed speed range nozzle 40 is positioned over the center point of wafer 20 and dispensing of solution from nozzle 40 over already rotating wafer 20 is initiated. Nozzle 40 moves radially away from the central point of wafer 20 while continuously dispensing the selected solution. The radial speed of nozzle 40 as it moves radially away from the center point of wafer 20 is constant. Dispensing of solution by nozzle 40 is discontinued at a predetermined position, here when nozzle 40 is within 1 cm of the outer edge of wafer 20. It is also possible that the direction of nozzle 40 could be reversed and start dispensing at the outside edge of wafer 20 and discontinue dispensing at the center point of wafer 20. The nozzle can be halted at the center by fixing a nozzle-stopper 50 in a position above the center of the chuck 12 and co-planar with the nozzle 40. In another embodiment nozzle 20 can begin dispensing at the outside edge of wafer 20, and dispense solution across a diameter of wafer 20 and discontinue at the opposite outside edge of wafer 20.

Nozzle 40 dispenses solution in the form of a fine mist in a dispersed and divergent pattern. Examples of appropriate nozzles include atomizing nozzles, airless spray nozzles, and the like. Nozzle 40 is supplied from a separate pressurized reservoir.

The fine mist spray dispensing of solution of this invention allows the wafer to be spun at a moderate speed. This more moderate speed allows less of the coating solution to be thrown off of the surface of wafer 20. This method allows up to a 90% efficiency in usage of coating solution in the process. This greatly increases the economy of semiconductor wafer production. One of the greatest expenses in the production of semiconductor wafers is the cost of the materials that wafer 20 must be coated with. With this method a satisfactorily uniform coating can still be applied but with a significantly smaller consumption of coating materials. This process works well for polymer dielectrics, but can also be used equally well for coating any solution onto the surface of semiconductor wafers including polysiloxanes, photo resists, developers, adhesives, protective coatings and the like.

It will therefore be understood that modifications and variations are possible without departing from the scope of the invention as expressed in the following claims.

I claim:

1. A spin-coat system for a processor defining a chamber and having a chuck in said chamber, comprising:

a nozzle above said chuck and slidably mounted to said processor; and a nozzle-stopper above said chuck, coplanar with said nozzle, and fixedly mounted to said processor, wherein said nozzle stopper is above a center of said chuck.

* * * * *

UNITED STATES PATENT AND TRADEMARK OFFICE
CERTIFICATE OF CORRECTION

PATENT NO.    : 5,902,399
DATED         : May 11, 1999
INVENTOR(S)   : Robert William Courtenay It is certified that error appears in the above-identified patent and that said Letters Patent is hereby corrected as shown below:

Title Page,
Item [57], ABSTRACT,
Line 2, delete "rotation" and replace it with -- rotating --.

Column 3,
Line 46, delete "their" and replace it with -- there --.

Column 4,
Line 17, add -- on -- after the term "depending".

Signed and Sealed this

Thirty-first Day of December, 2002

JAMES E. ROGAN
*Director of the United States Patent and Trademark Office*